United States Patent
Roychowdhury et al.

(10) Patent No.: US 11,592,468 B2
(45) Date of Patent: Feb. 28, 2023

(54) SYSTEM AND METHOD FOR CIRCUIT TESTING USING REMOTE COOPERATIVE DEVICES

(71) Applicant: Ford Global Technologies, LLC, Dearborn, MI (US)

(72) Inventors: Rajarshi Roychowdhury, Dearborn, MI (US); David Jeffeory Berels, Plymouth, MI (US); Mahmoud Yousef Ghannam, Canton, MI (US); Scott Mayberry, Allen Park, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 502 days.

(21) Appl. No.: 16/775,856

(22) Filed: Jan. 29, 2020

(65) Prior Publication Data
US 2020/0249262 A1 Aug. 6, 2020

Related U.S. Application Data

(60) Provisional application No. 62/800,876, filed on Feb. 4, 2019.

(51) Int. Cl.
*B64C 39/02* (2006.01)
*G01R 27/26* (2006.01)
(Continued)

(52) U.S. Cl.
CPC ............ *G01R 27/26* (2013.01); *B64C 39/024* (2013.01); *G01R 31/2832* (2013.01);
(Continued)

(58) Field of Classification Search
CPC .... G01R 27/26; G01R 31/2832; B64C 39/024
See application file for complete search history.

(56) References Cited

U.S. PATENT DOCUMENTS 5,469,064 A 11/1995 Kerschner et al.
6,032,357 A 3/2000 Wojewnik
(Continued)

FOREIGN PATENT DOCUMENTS

| CA | 2577269 | 7/2008 |
|----|---------|--------|
| CN | 108537913 | 9/2018 |
| JP | 2000171512 | 6/2000 |

OTHER PUBLICATIONS

SRI International, MicroFactory Platform for Smart Manufacturing, pp. 1-3, Sep. 28, 2018.

*Primary Examiner* — Minh Q Phan
(74) *Attorney, Agent, or Firm* — Burris Law, PLLC

(57) ABSTRACT

A system for testing a plurality of electrical circuits includes a first remote cooperative testing device including a testing component and a first transceiver and a second remote cooperative testing device including a conductive component and a second transceiver. In response to receiving instructions from a remote computing device, the first remote cooperative testing device locates a first electrical circuit and a second electrical circuit and selectively positions the testing component to electrically couple a first portion of the first electrical circuit to a first portion of the second electrical circuit at a first node, and the second remote cooperative testing device selectively positions the conductive component to electrically couple a second portion of the first electrical circuit to a second portion of the second electrical circuit at a second node, thereby forming a testing circuit between the first node and the second node.

20 Claims, 12 Drawing Sheets

(51) Int. Cl.
 *G01R 31/28* (2006.01)
 *B64D 47/08* (2006.01)
(52) U.S. Cl.
 CPC .... *B64C 2201/027* (2013.01); *B64C 2201/12* (2013.01); *B64C 2201/127* (2013.01); *B64C 2201/146* (2013.01); *B64D 47/08* (2013.01)

(56) References Cited

U.S. PATENT DOCUMENTS

| | | |
|---|---|---|
| 6,344,613 B1 | 2/2002 | Kolodziej |
| 6,640,434 B1 | 11/2003 | Wojewnik et al. |
| 9,805,857 B2 | 10/2017 | Jeong |
| 11,105,841 B2 * | 8/2021 | Bonaria ............. G01R 1/06716 |
| 2006/0043153 A1 | 3/2006 | Yamaoka et al. |
| 2017/0113799 A1 | 4/2017 | Kovac et al. |

* cited by examiner

SYSTEM AND METHOD FOR CIRCUIT TESTING USING REMOTE COOPERATIVE DEVICES

CROSS-REFERENCE TO RELATED APPLICATIONS

This application claims the benefit of U.S. Provisional Application No. 62/800,876, filed on Feb. 4, 2019. The entire disclosure of the above application is incorporated herein by reference.

FIELD

The present disclosure relates to systems and methods for testing electrical circuits.

BACKGROUND

The statements in this section merely provide background information related to the present disclosure and may not constitute prior art.

Various methods may be implemented to deposit electrical circuits onto an object, such as a body of a motor vehicle. For example, a robotic arm may include one or more printing heads mounted thereon that deposit various electrical circuit components onto a vehicle body, such as conductive paths, discrete elements (e.g., resistors, capacitors, inductors, transistors, among others), diodes, semiconductors, a dielectric substrate and/or coatings, among others.

During and/or after the deposition of the electrical circuits onto the vehicle body, the electrical circuits may be subjected to various testing procedures to verify that the electrical circuits comply with various operational specifications. For example, an operator may test the electrical circuits for continuity, improper grounding, and the like, using a wiring test board. However, a wiring test board requires the implementation of various electrical interfaces to ensure that each node of the electrical circuits is properly tested. Furthermore, an operator is required to locate, identify, and manipulate the positioning of the wiring test board in order to execute the various testing procedures, which may be time-consuming and labor intensive. These issues with the use of wiring test boards, among other issues with testing circuits that are deposited onto an object such as a vehicle body, are addressed by the present disclosure.

SUMMARY

This section provides a general summary of the disclosure and is not a comprehensive disclosure of its full scope or all of its features.

The present disclosure provides a system for testing a plurality of electrical circuits, each electrical circuit having a plurality of nodes. The system comprises: a first remote cooperative testing device comprising a testing component and a first transceiver. The first remote cooperative testing device has a machine operated mode of transportation. The system comprises a second remote cooperative testing device comprising a conductive component and a second transceiver. The second remote cooperative testing device has a machine operated mode of transportation. In response to receiving instructions from a remote computing device, the first remote cooperative testing device locates a first electrical circuit and a second electrical circuit of the plurality of electrical circuits and selectively positions the testing component to electrically couple a first portion of the first electrical circuit to a first portion of the second electrical circuit at a first node. In response to receiving instructions from a remote computing device, the second remote cooperative testing device selectively positions the conductive component to electrically couple a second portion of the first electrical circuit to a second portion of the second electrical circuit at a second node, thereby forming a testing circuit between the first node and the second node.

The present disclosure provides another system for testing a plurality of electrical circuits, each electrical circuit having a plurality of nodes. The system comprises a first remote cooperative testing device comprising a testing component and a first transceiver. The first remote cooperative testing device has a machine operated mode of transportation. The system also comprises a second remote cooperative testing device comprising a conductive component and a second transceiver. The second remote cooperative testing device has a machine operated mode of transportation. The system also includes a processor configured to execute machine-readable instructions stored in a nontransitory computer-readable medium. The machine-readable instructions comprise transmitting, using the processor, a first navigation signal to the first remote cooperative testing device and the second remote cooperative testing device. The first navigation signal causes the first remote cooperative testing device to locate a first electrical circuit and a second electrical circuit of the plurality of electrical circuits and selectively position the testing component to electrically couple a first portion of the first electrical circuit to a first portion of the second electrical circuit at a first node. The first navigation signal causes the second remote cooperative device to selectively position the conductive component to electrically couple a second portion of the first electrical circuit to a second portion of the second electrical circuit at a second node, thereby forming a testing circuit between the first node and the second node. The machine-readable instructions comprise generating, using the processor, an output representing at least one of an impedance of the first electrical circuit and an impedance of the second electrical circuit.

The present disclosure also provides a method for testing a plurality of electrical circuits, where each electrical circuit has a plurality of nodes. the method comprises: deploying a first remote cooperative testing device to a first node of the plurality of nodes and deploying a second remote cooperative testing device to a second node of the plurality of nodes, the first remote cooperative testing device comprising a testing component and the second remote cooperative testing device comprising a conductive component; and determining whether a testing condition is satisfied. In response to determining that the testing condition is satisfied, the method comprises: selectively positioning, using the first remote cooperative testing device, the testing component to electrically couple a first portion of the first electrical circuit to a first portion of the second electrical circuit; and selectively positioning, using the second remote cooperative testing device, the conductive component to electrically couple a second portion of the first electrical circuit to a second portion of the second electrical circuit, thereby forming a testing circuit between the first node and the second node.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

Figure 1A:
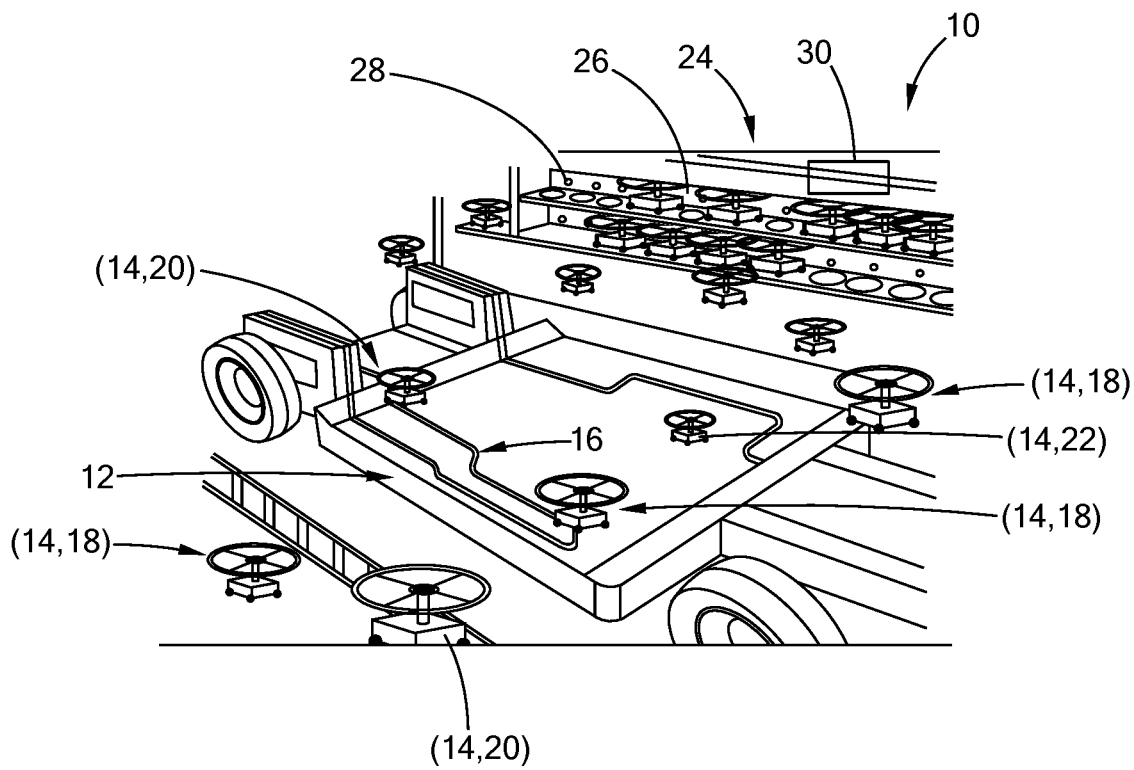
FIG. 1A is a perspective view of a system for manufacturing electrical circuits on a vehicle in accordance with the teachings of the present disclosure.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

Figure 1B:
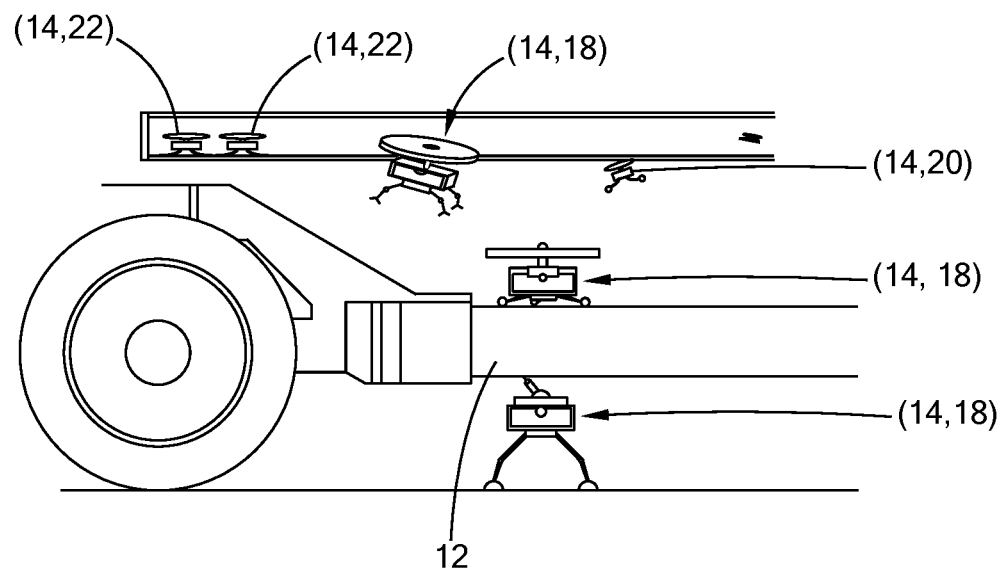
FIG. 1B is a side view of a portion of the system illustrated in FIG. 1A in accordance with the teachings of the present disclosure.

Referring to FIGS. 1A-1B, a manufacturing system 10 for manufacturing and testing a component 12, such as a vehicle body, is provided. The manufacturing system 10 generally includes a plurality of remote devices 14. As used herein, the phrase "remote cooperative device" refers to a device that, in conjunction with another device, performs a manufacturing and/or testing function such as depositing an electrical circuit 16 onto a vehicle component 12, generating a circuit path for depositing the electrical circuit 16, or testing an electrical circuit 16 of the vehicle component 12, among other operations. The plurality of remote devices 14 can be implemented by various devices, such as an unmanned vehicle (e.g., an unmanned aerial vehicle, such as a drone; and/or an unmanned ground vehicle, such as an autonomous vehicle). For example, the plurality of remote devices 14 can be implemented by a plurality of miniature autonomous robotic vehicles (MARVs). As used herein, the term "MARV" refers to an autonomous aerial vehicle (e.g., an autonomous drone) or an autonomous ground vehicle (e.g., an autonomous vehicle having one or more wheels configured to roll on the vehicle component 12) having a volume permitting the autonomous aerial/ground vehicle to access each location of the vehicle component 12. For example, the MARV may have a volume of approximately one cubic inch. It should be understood that the MARV may have various other volumes in other forms.

The plurality of remote devices 14 have a machine operated mode of transportation. As used herein, the phrase "machine mode of transportation" refers to the plurality of remote devices 14 being configured to move by inputs from a computer and sensor data, autonomously or semi-autonomously, within the manufacturing system 10 and beyond. As non-limiting examples, the machine mode of transportation may be at least one of a ground transportation mode (e.g., the plurality of remote devices 14 roll on the vehicle component 12), an air transportation mode (e.g., the plurality of remote devices 14 are drones that travel in an airspace within the manufacturing system 10), and a robotic arm transportation mode (e.g., the plurality of remote devices 14 are attached to a robotic arm during at least a portion of a circuit deposition operation, a navigation operation, and a testing operation).

The plurality of remote devices 14 is configured to perform various deposition, navigation, and testing operations, among others. In some forms, the plurality of remote devices 14 includes remote manufacturing devices 18 that are configured to deposit various electrical circuit components of the electrical circuit 16, such as conductive paths, discrete elements (e.g., resistors, capacitors, inductors, transistors, among others), diodes, semiconductors, a dielectric substrate and/or dielectric coating, among others, onto the vehicle component 12. In some forms, the remote manufacturing devices 18 deposit the electrical circuit components of the electrical circuits 16 using a circuit deposition system positioned thereon, as described below in further detail. In some forms, the remote manufacturing devices 18 may be cooperative devices or independently operable devices.

In some forms, the remote manufacturing devices 18 include an imaging system that enables the remote manufacturing devices 18 to identify, using an image sensor of the imaging system (e.g., a camera), a laser beam having predefined characteristics (e.g., a color). As described below in further detail, the remote manufacturing devices 18 deposit the electrical circuits 16 based on the identified laser beam and one or more locations of the vehicle component 12 associated with the identified light.

In some forms, the plurality of remote devices 14 includes remote navigation devices 20 that are configured to obtain geometric information of the vehicle component 12. For example and as described below in further detail with reference to FIGS. 2A-2E, the remote navigation devices 20 generates a three-dimensional (3D) image of the vehicle component 12 based on image data obtained by an image sensor of the scanning system, such as a radar, and the remote navigation devices 20 generate the electrical circuit path based on obtained image data. Furthermore, the remote navigation devices 20 emit a beam of light corresponding to the generated electrical circuit path, thereby enabling the remote manufacturing devices 18 to identify the corresponding location of the vehicle component 12 while depositing the electrical circuits 16, as described below in further detail with reference to FIGS. 2A-2E. In some forms, the remote navigation devices 20, the remote navigation devices 20 emit the beam of light to bond the electrical circuits 16 to the vehicle component 12, as described below in further detail with reference to FIGS. 2A-2E. In some forms, the remote navigation devices 20 are cooperative devices or independently operable devices.

In some forms, the plurality of remote devices 14 includes remote cooperative testing devices 22 that are configured to execute testing procedures for identifying various characteristics of the electrical circuits 16. As non-limiting examples, the remote cooperative testing devices 22 may test the electrical circuits 16 for continuity and/or a short to ground, perform impedance measurements of the electrical circuits 16, and the like, as described below in further detail with reference to FIGS. 2A-2E.

In some forms, the manufacturing system 10 includes a remote cooperative device control system 24 that includes one or more subsystems for controlling the physical operations of the plurality of remote devices 14 and logical operations of the remote devices 14. For example, the remote cooperative device control system 24 includes a charging substation 26 configured to provide electrical power to each of the plurality of remote devices 14. As another non-limiting example, the remote cooperative device control system 24 includes maintenance stations 28 configured to provide various maintenance operations to the plurality of remote devices 14, such as diagnostic testing, cleaning, material refilling, and the like. As yet another non-limiting example, the remote cooperative device control system 24 includes a computing device 30 configured to execute at least a portion of the logical operations described herein.

Referring now to FIGS. 2A-2E, a block diagram of the manufacturing system 10 is provided. As described above with reference to FIGS. 1A-1B, the manufacturing system 10 includes the vehicle component 12, the remote cooperative testing devices 14, and the remote cooperative device control system 24, which includes the computing device 30 and maintenance substation 28. In some forms, the computing device 30 includes one or more processors 34 configured to execute machine-readable instructions stored on one or more computer-readable mediums 36. In some forms, the machine-readable instructions of the one or more computer-readable mediums 36 are implemented by an environment module 38, a maintenance module 40, a vehicle component position module 42, a motion control module 44, and a task manager module 46. While the one or more processors 34 and the one or more computer-readable mediums 36 are illustrated within the computing device 30, it should be understood that at least a set of the one or more processors 34 and/or the one or more computer-readable mediums 36 may be included within at least a set of the plurality of remote devices 14 in other forms. In some forms, the manufacturing system 10 includes an environment detection system 50 and the vehicle component position system 52.

Figure 2A:
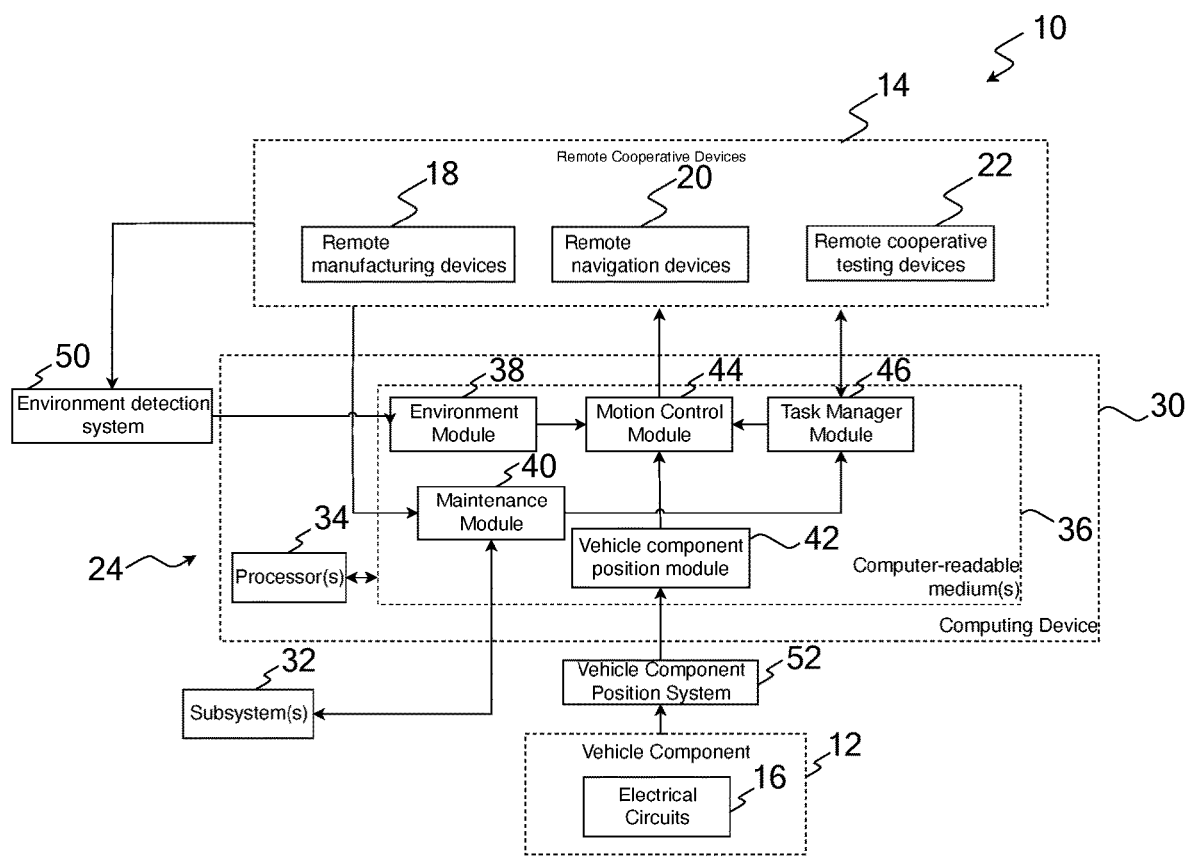
FIG. 2A is a block diagram of a system for testing electrical circuits in accordance with the teachings of the present disclosure.
Figure 2B:
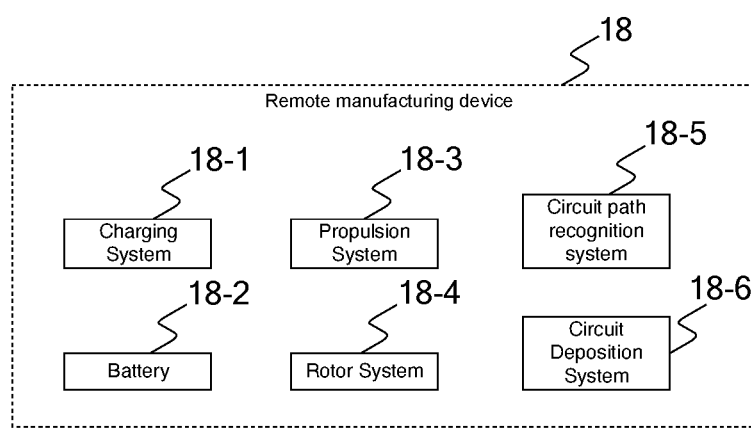
FIG. 2B is a block diagram of a remote manufacturing device of the system illustrated in FIG. 2A in accordance with the teachings of the present disclosure.

In some forms and as illustrated in FIG. 2B, the remote manufacturing device 18 each include a charging system 18-1, a battery 18-2, a propulsion system 18-3, a rotor system 18-4, a circuit path recognition system 18-5, and a circuit deposition system 18-6. The charging system 18-1 includes one or more hardware components for interfacing the battery 18-2 with, for example, the charging substation 26, thereby enabling the battery 18-2 to receive an electrical charge from the charging substation 26. The battery 18-2 is configured to provide electrical power to the various components of the remote manufacturing device 18. In some forms, the remote manufacturing device 18 includes a DC-DC converter, an AC-DC converter, an AC-AC converter, and/or a DC-AC converter in order to convert the voltage of the battery 18-2 into a suitable voltage level for operating the various components of the remote manufacturing device 18. In some forms, the propulsion system 18-3 is configured to the electrical power received from the battery 18-2 into mechanical power to drive the remote manufacturing device 18. For example, the propulsion system 18-3 includes an engine or motor that drives the rotor system 18-4.

In some forms, the circuit path recognition system 18-5 includes one or more imaging sensors, such as a camera, laser, and infrared sensor, among others, and one or more processors configured to execute instructions stored in a computer-readable medium. When the one or more processors execute the instructions stored in the computer-readable medium, the circuit path recognition system 18-5 identifies a laser beam emitted by a first remote navigation device 20 and actuates the propulsion system 18-3 and the rotor system 18-4 such that the remote manufacturing device 18 follows the laser beam emitted by the first remote navigation device 20. In some forms, executing the instructions stored in the computer-readable medium causes the one or more processors of the circuit path recognition system 18-5 to identify the color of the laser beam, determine whether the color of the laser beam is associated with the remote manufacturing device 18, and, in response to determining the color of the laser beam is associated with the remote manufacturing device, actuate the propulsion system 18-3 and the rotor system 18-4 such that the remote cooperative paint device 18 follows the laser beam emitted by the first remote navigation device 20. While the above machine-readable instructions are described as being executed by one or more processors of the circuit path recognition system 18-5, it should be understood that the machine-readable instructions may be stored on the one or more computer-readable mediums 36 of the computing device 30, and/or the one or more processors 34 of the computing device 30 may execute the above machine-readable instructions in some forms.

In some forms, the remote manufacturing devices 18 deposit the electrical circuit components of the electrical circuits 16 using circuit deposition system 18-6 positioned thereon. For example, the circuit deposition system 18-6 includes a reservoir in which a material utilized to form the conductive path (e.g., copper, nickel, aluminum, platinum, a copper alloy, a nickel alloy, an aluminum alloy, a platinum alloy, and the like) or a dielectric material (e.g., silicon) is stored. When a gas is provided into the reservoir via a gas inlet, the material within the reservoir is atomized to create droplets with entrained particles. A virtual impactor and pneumatic atomizer then convert the droplets into a mist state. The material is then provided to a deposition head, which ejects the droplets onto the vehicle component 12. It should be understood that the remote manufacturing devices 18 may deposit the electrical circuit components using various other systems in other forms and is not limited to the forms described herein. In some forms, the remote manufacturing devices 18 may deposit the electrical circuit components of the electrical circuit 16 such that they are substantially aligned with the laser beam emitted by the first remote navigation device 20.

Figure 2C:
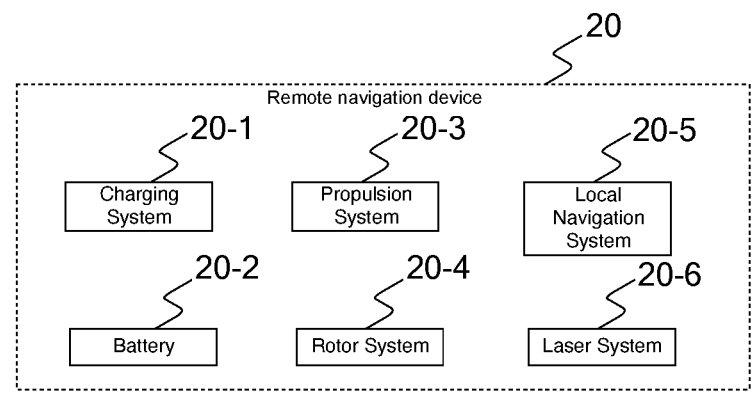
FIG. 2C is a block diagram of a remote navigation device of the system illustrated in FIG. 2A in accordance with the teachings of the present disclosure.

In some forms and as illustrated in FIG. 2C, the remote navigation device 20 includes a charging system 20-1, a battery 20-2, a propulsion system 20-3, a rotor system 20-4, a local navigation system 20-5, and a laser system 20-6. The charging system 20-1 includes one or more hardware components for interfacing the battery 20-2 with, for example, the charging substation 26, thereby enabling the battery 20-2 to receive an electrical charge from the charging substation 26. The battery 20-2 is configured to provide electrical power to the various components of the remote navigation device 20. In some forms, the remote navigation device 20 includes a DC-DC converter, an AC-DC converter, an AC-AC converter, and/or a DC-AC converter in order to convert the voltage of the battery 20-2 into a suitable voltage level for operating the various components of the remote navigation device 20. In some forms, the propulsion system 20-3 is configured to the electrical power received from the battery 20-2 into mechanical power to drive the remote navigation device 20. For example, the propulsion system 20-3 includes an engine or motor that drives the rotor system 20-4.

The local navigation system 20-5 may include one or more imaging sensors (e.g., a camera, radar sensor, infrared sensor, and the like), one or more positioning sensors (e.g., an ultra-wideband (UWB) sensor, a near-field communication (NFC) sensor, among others), communication hardware (e.g., a radio transceiver system configured to transmit and receive signals in a corresponding wireless communication band), and one or more processors configured to execute instructions stored in a computer-readable medium. When the one or more processors execute the instructions stored in the computer-readable medium, the one or more imaging sensors of the local navigation system 20-5 are configured to obtain image data of the vehicle component 12, and the one or more processors are configured to generate a 3D image of the vehicle component 12 based on the 3D image data. Furthermore, when the one or more processors execute the instructions stored in the computer-readable medium, the one or more positioning sensors transmit location information associated with the remote navigation device 20 to the computing device 30.

When the one or more processors execute the instructions stored in the computer-readable medium, the laser system 20-6, which is a laser source in some forms, executes a sintering function by emitting the laser beam, thereby enabling the electrical circuits 16 to bond with the vehicle component 12. While the above machine-readable instructions are described as being executed by one or more processors of the remote navigation devices 20, it should be understood that the machine-readable instructions may be stored on the one or more computer-readable mediums 36 of the computing device 30, and/or the one or more processors 34 of the computing device 30 may execute the above machine-readable instructions in some forms.

Figure 2D:
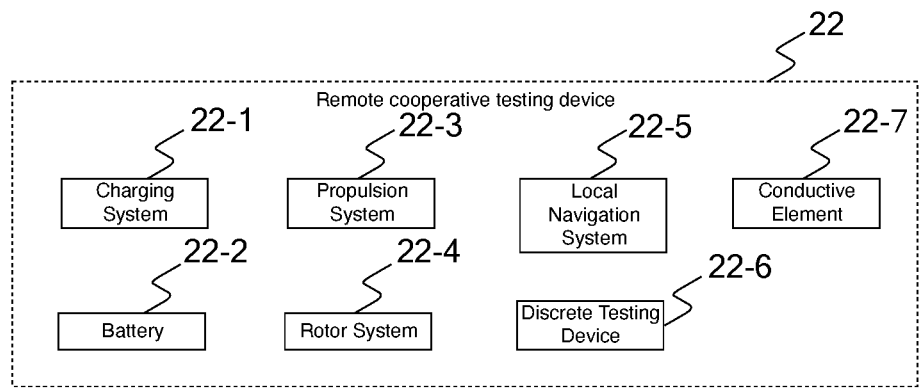
FIG. 2D is a block diagram of a remote cooperative testing device of the system illustrated in FIG. 2A in accordance with the teachings of the present disclosure.
Figure 2E:
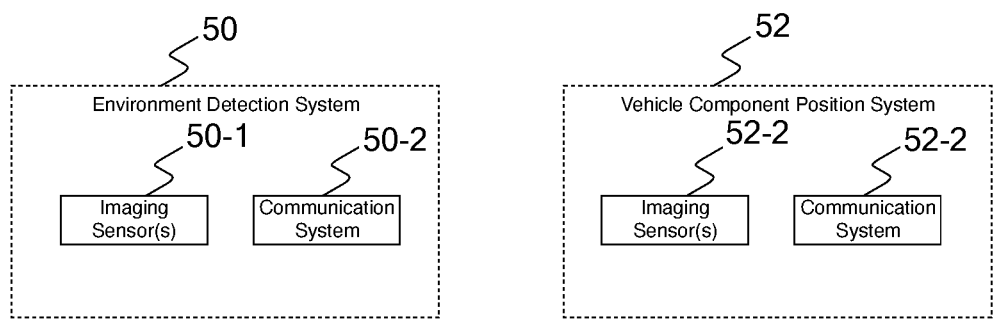
FIG. 2E is a block diagram of an environment detection system of the system illustrated in FIG. 2A in accordance with the teachings of the present disclosure.

In some forms and as illustrated in FIG. 2D, the remote cooperative testing device 22 includes a charging system 22-1, a battery 22-2, a propulsion system 22-3, a rotor system 22-4, a local navigation system 22-5, a discrete testing device 22-6, and a conductive element 22-7. The charging system 22-1 includes one or more hardware components for interfacing the battery 22-2 with, for example, the charging substation 26, thereby enabling the battery 22-2 to receive an electrical charge from the charging substation 26. The battery 22-2 is configured to provide electrical power to the various components of the remote cooperative testing device 22. In some forms, the remote cooperative testing device 22 includes a DC-DC converter, an AC-DC converter, an AC-AC converter, and/or a DC-AC converter in order to convert the voltage of the battery 22-2 into a suitable voltage level for operating the various components of the remote cooperative testing device 22. In some forms, the propulsion system 22-3 is configured to the electrical power received from the battery 22-2 into mechanical power to drive the remote cooperative testing device 22. For example, the propulsion system 22-3 includes an engine or motor that drives the rotor system 22-4.

The local navigation system 22-5 may include one or more positioning sensors (e.g., a UWB sensor, an NFC sensor, among others), communication hardware (e.g., a radio transceiver system configured to transmit and receive signals in a corresponding wireless communication band), and one or more processors configured to execute instructions stored in a computer-readable medium. When the one or more processors execute the instructions stored in the computer-readable medium, the one or more positioning sensors transmit location information associated with the remote cooperative testing device 22 to the computing device 30. While the above machine-readable instructions are described as being executed by one or more processors of the remote cooperative testing devices 22, it should be understood that the machine-readable instructions may be stored on the one or more computer-readable mediums 36 of the computing device 30, and/or the one or more processors 34 of the computing device 30 may execute the above machine-readable instructions in some forms.

Now referring to FIGS. 2A-2E, a brief description of the functionality of the various modules of the computing device 30 will now be provided. In some forms, the environment detection system 50 may include one or more imaging sensors 50-1 (illustrated in FIG. 2E), such as a radar sensor, a LIDAR sensor, a camera, and/or the like, that obtain environment information indicating a location and/or relative proximity of each of the remote devices 14, the one or more subsystems 32 (i.e., the charging substation 26 and the maintenance substation 28), and/or other components within the manufacturing system 10. The environment detection system 50 may subsequently communicate, using communication system 50-2 (illustrated in FIG. 2E), the environment information to the computing device 30. In some forms, the communication system 50-2 may include various network interfacing hardware for transmitting the environment information using at least one of a wired communication protocol (e.g., hardware for communicating via a universal serial bus, a category 5 cable, a serial cable, and the like) and a wireless communication protocol (e.g., hardware for communicating via a Bluetooth® protocol, a cellular protocol, a wireless fidelity (Wi-Fi) protocol, an NFC protocol, a UWB protocol, and the like).

When the one or more processors 34 execute the machine-readable instructions of the environment module 38, the computing device 30 generates, based on the received environment information, a trajectory for at least one of the remote devices 14. For example, when the one or more processors 34 execute the instructions of the environment module 38, the one or more processors 34 generate an aerial trajectory for a remote device 14 that is an autonomous aerial vehicle type, such as a drone. As another non-limiting example, when the one or more processors 34 execute the instructions of the environment module 38, the one or more processors 34 generate a trajectory along the vehicle component 12 for at least one of the remote devices 14 based on the received environment information.

In some forms, the vehicle component position system 52 includes one or more imaging sensors, such as a radar sensor, a LIDAR sensor, a camera, and/or the like, that obtain information indicating a location and/or relative proximity of the vehicle component 12. The vehicle component position system 52 may subsequently communicate, using communication system 52-2 (illustrated in FIG. 2E), the vehicle component position information to the computing device 30. In some forms, the communication system 52-2 may include various network interfacing hardware for transmitting the environment information using at least one of a wired communication protocol (e.g., hardware for communicating via a universal serial bus, a category 5 cable, a serial cable, and the like) and a wireless communication protocol (e.g., hardware for communicating via a Bluetooth® protocol, a cellular protocol, a Wi-Fi protocol, an NFC protocol, a UWB protocol, and the like). When the one or more processors 34 execute the machine-readable instructions of the vehicle component position module 42, the computing device 30 determines the position of the vehicle component 12 within the manufacturing system 10 based on the received vehicle component position information.

In some forms, when the one or more processors 34 execute the task manager module 46, the computing device 30 is configured to obtain status information from the remote devices 14. For example, the computing device 30 may obtain a status of the remote manufacturing devices 18 (e.g., ready to deposit, depositing, in transit, crawling, maintenance, in transit, error, among others). As another non-limiting example, when the one or more processors 34 execute the task manager module 46, the computing device 30 is configured to obtain status information from the remote navigation devices 20 (e.g., ready, active, in transit, scanning, sintering, in maintenance, among others) and the remote cooperative testing devices 22 (e.g., ready, active, in transit, testing, maintenance, among others). Furthermore, when the one or more processors 34 execute the task manager module 46, the computing device 30 designates or assigns the operations of the remote devices 14 based on the status of the remote devices 14 (e.g., the computing device 30 assigns a first set of the remote devices 14 as remote manufacturing devices 18 in response to the status of the first set of the remote devices 14 being in a ready state).

When the one or more processors 34 execute the motion control module 44, the computing device 30 generates the electrical circuit path based on the position of the vehicle component 12, the environment information obtained by the environment detection system 50, the status information, and/or the image data obtained by the remote navigation devices 20. Furthermore, when the one or more processors 34 execute the motion control module 44, the computing device 30 transmits the electrical circuit paths to the corresponding remote devices 14 in order to perform one of a deposition operation, navigation operation, and testing operation.

Now referring to FIGS. 3A-3D, an example illustration of the remote cooperative testing devices 22A, 22B, 22C, 22D (collectively referred to as cooperative testing devices 22') are schematically depicted. As described above, each of the remote cooperative testing devices 22' includes at least one of the discrete testing device 22-6 and the conductive element 22-7.

Figure 3A:
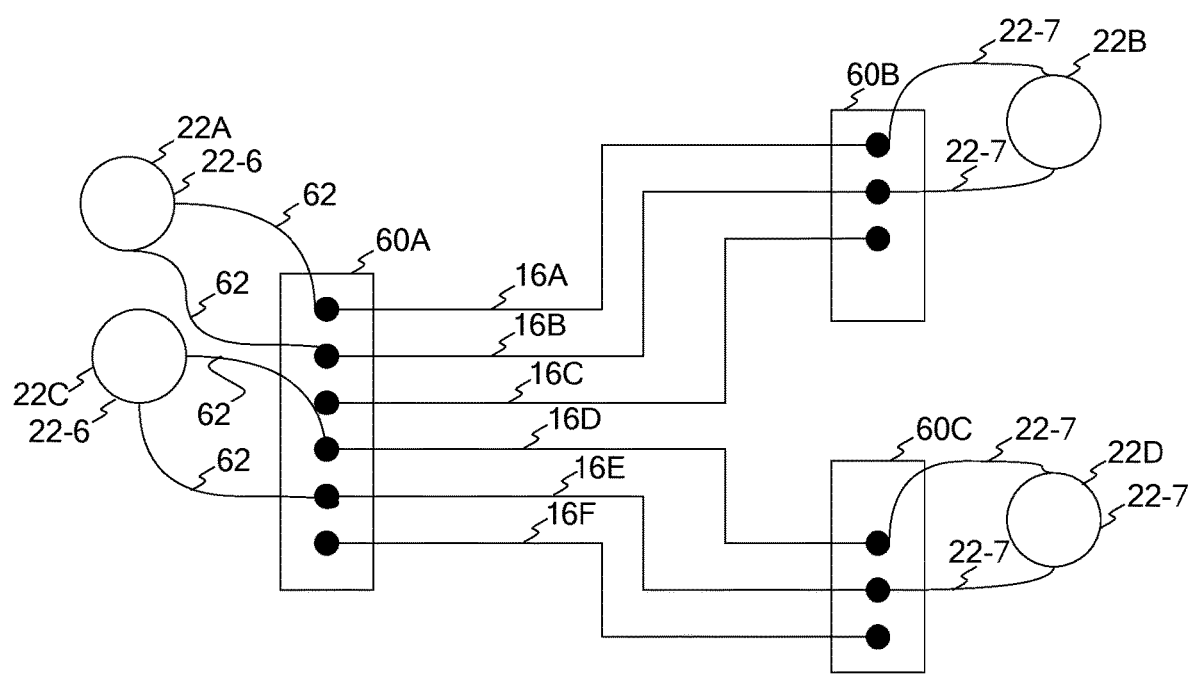
FIG. 3A is a schematic diagram of a first remote cooperative testing device and a second remote cooperative testing device executing a first test iteration of a testing procedure of a symmetrical circuit configuration in accordance with the teachings of the present disclosure.
Figure 3B:
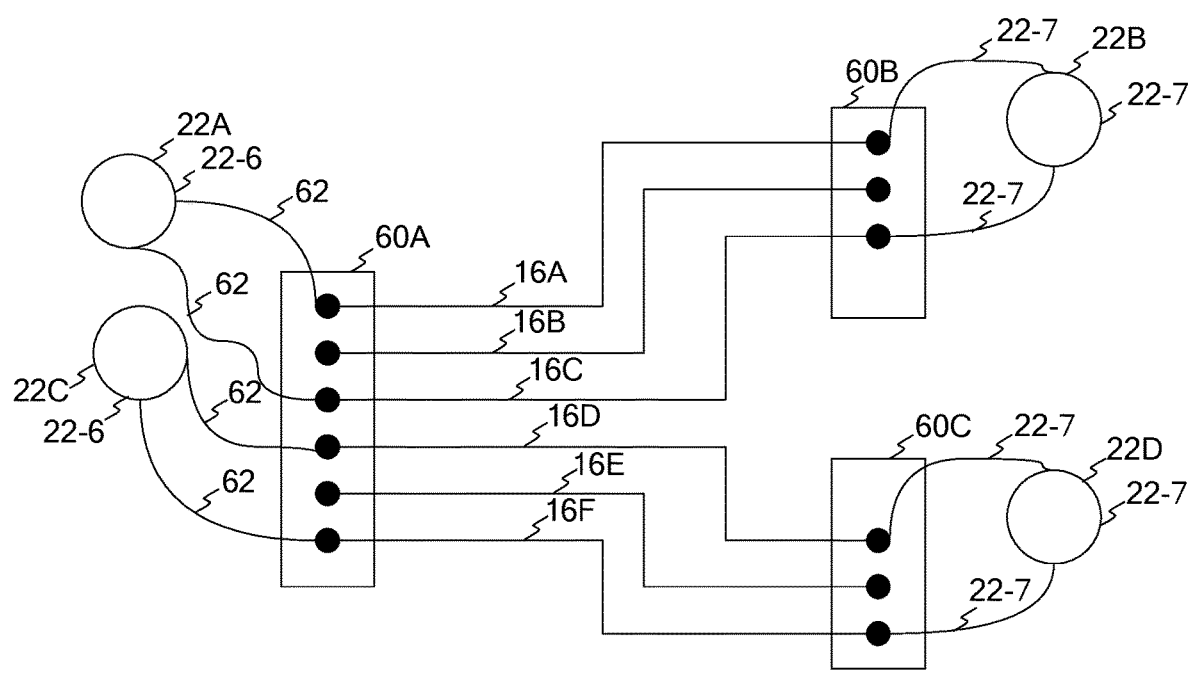
FIG. 3B is a schematic diagram of a first remote cooperative testing device and a second remote cooperative testing device executing a second test iteration of a testing procedure of a symmetrical circuit configuration in accordance with the teachings of the present disclosure.
Figure 3C:
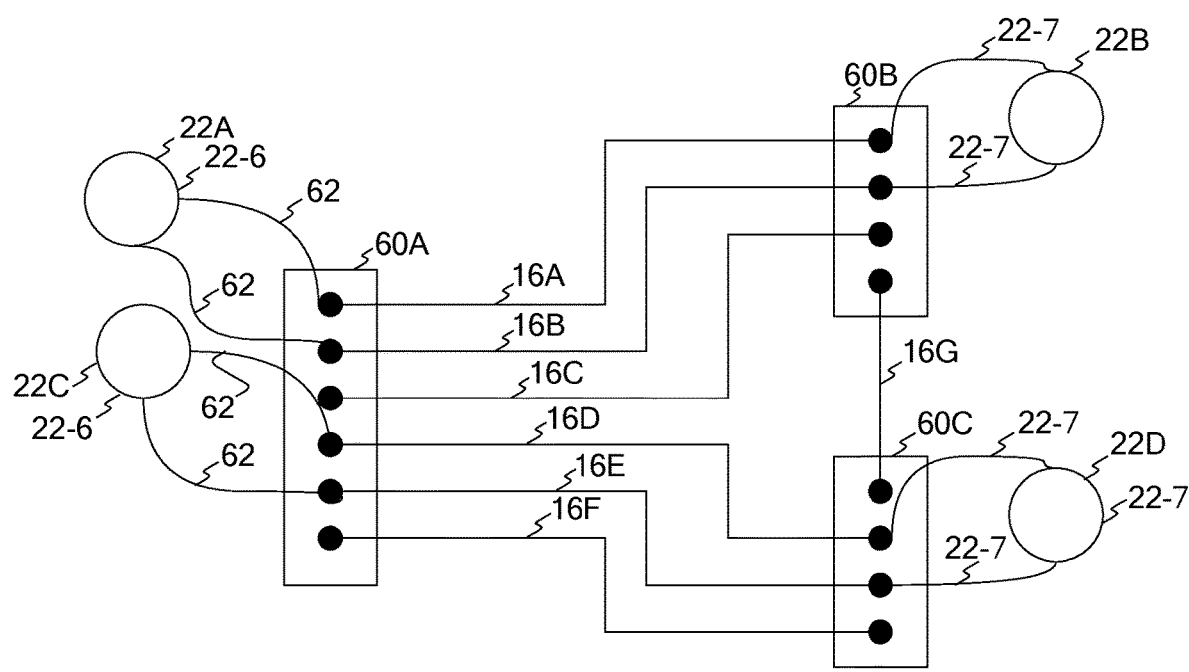
FIG. 3C is a schematic diagram of a first remote cooperative testing device and a second remote cooperative testing device executing a first test iteration of a testing procedure of an asymmetrical circuit configuration in accordance with the teachings of the present disclosure.
Figure 3D:
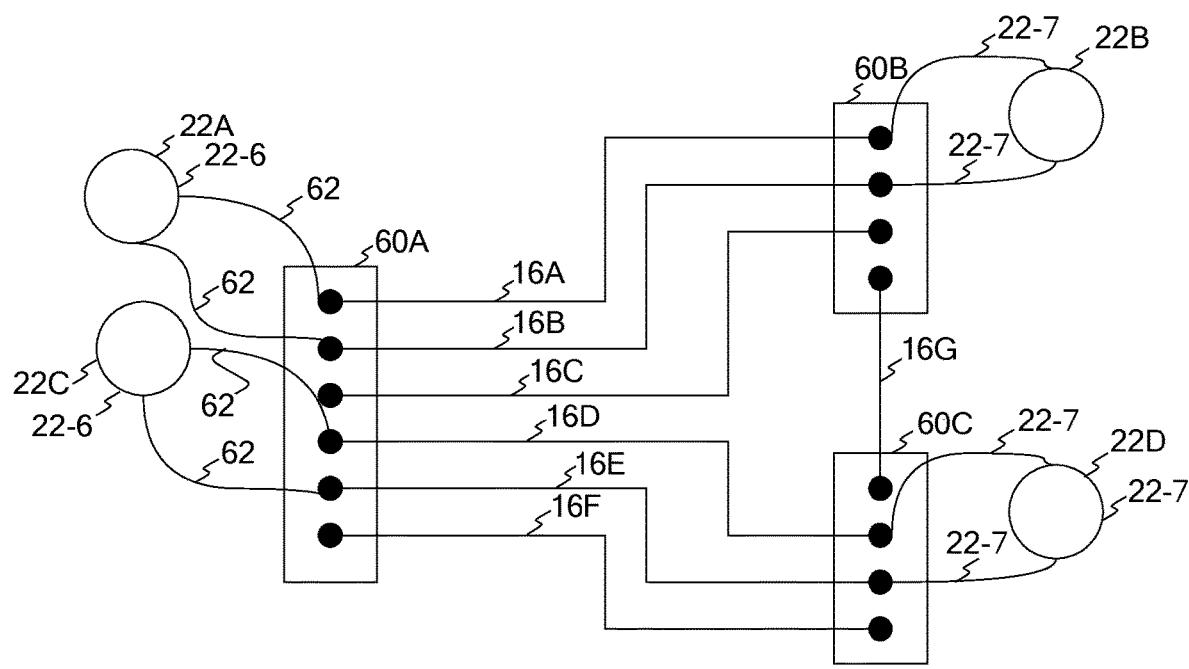
FIG. 3D illustrates is a schematic diagram of a first remote cooperative testing device and a second remote cooperative testing device executing a second test iteration of a testing procedure of an asymmetrical circuit configuration in accordance with the teachings of the present disclosure.

With reference to FIGS. 3A-3B, the electrical circuits 16A, 16B, 16C, 16D, 16E, 16F are arranged in a symmetrical circuit configuration. As used herein, the phrase "symmetrical circuit configuration" refers to a system in which a total number of electrical circuits 16 is an even number. With reference to FIGS. 3C-3D, the electrical circuits 16A, 16B, 16C, 16D, 16E, 16F, 16G are arranged in an asymmetrical circuit configuration. As used herein, the phrase "asymmetrical circuit configuration" refers to a system in which a total number of electrical circuits 16 is an odd number.

In some forms and now referring to FIGS. 3A-3D, the discrete testing device 22-6 is an ohmmeter configured to measure an impedance (e.g., a resistance) of at least one of the electrical circuits 16A, 16B, 16C, 16D, 16E, 16F, 16G (collectively referred to as electrical circuits 16'). In some forms, the discrete testing device 22-6 is an LCR (inductance (L), capacitance (C), resistance (R)) meter configured to measure the impedance (e.g., a reactance) of at least one of the electrical circuits 16'. In some forms, each discrete testing device 22-6 includes testing probes 62 that are selectively positioned at various ends of the electrical circuits 16 and at least one of the nodes 60A, 60B, 60C (collectively referred to as nodes 60') during one or more testing iterations, as described below in further detail. While FIGS. 3A-3D illustrate each of the discrete testing devices 22-6 having two testing probes 62, it should be understood that the discrete testing devices 22-6 may have more or less testing probes 62 in other forms. In some forms, the conductive element 22-7 is a wire, relay, semiconductor, and/or other electrical element configured to form an electrical junction between at least one of the electrical circuits 16' at one of the nodes 60'.

With continued reference to FIGS. 3A-3D, the discrete testing device 22-6 and the conductive element 22-7 are configured to test various electrical parameters of the electrical circuits 16' including, but not limited to, DC resistance, AC impedance, continuity, and continuity to ground. In some forms, the testing probes 62 of the discrete testing device 22-6 and the conductive element 22-7 each include a plurality of conductor interface pins that are compatible with the nodes 60' and enable the discrete testing device 22-6 and the conductive element 22-7 to make an electrical connection with various portions of the electrical circuits 16' at the nodes 60'.

As described above, when the one or more processors 34 execute the task manager module 46, the computing device 30 assigns the operations of the remote devices 14 based on the status of the remote devices 14. For example, the computing device 30 may assign the remote cooperative testing devices 22 to execute the testing protocol. In response to receiving the instructions corresponding to the assigned operations and as illustrated in FIGS. 3A and 3C, a first remote cooperative testing device (e.g., remote cooperative testing device 22A) locates a first electrical circuit (e.g., electrical circuit 16A) and a second electrical circuit (e.g., electrical circuit 16B) and selectively positions the discrete testing device 22-6 to electrically couple a first portion of the first electrical circuit (e.g., a first end of electrical circuit 16A) to a first portion of the second electrical circuit (e.g., a first end of electrical circuit 16B) at a first node (e.g., node 60A). Furthermore, in response to receiving the instructions corresponding to the assigned operations and as illustrated in FIGS. 3A and 3C, a second remote cooperative testing device selectively positions the conductive element 22-7 to electrically couple a second portion of the first electrical circuit (e.g., a second end of electrical circuit 16A) to a second portion of the second electrical circuit (e.g., a second end of electrical circuit 16B) at a second node (e.g., node 60B), thereby forming a testing circuit between the first node (e.g., node 60A) and the second node (node 60B).

In some forms, the first remote cooperative testing device (e.g., remote cooperative testing device 22A) selectively positions the discrete testing device 22-6 to electrically couple the first portion of the first electrical circuit (e.g., a first end of electrical circuit 16A) to the first portion of the second electrical circuit (e.g., a first end of electrical circuit 16B) in response to a determination that the first electrical circuit (e.g., electrical circuit 16A) and the second electrical circuit (e.g., electrical circuit 16B) satisfy a testing condition. For example, the testing condition is whether a conductive path can be formed between the first electrical circuit and the second electrical circuit.

In some forms, in response to the first remote cooperative testing device (e.g., remote cooperative testing device 22A) and the second remote cooperative testing device (e.g., remote cooperative testing device 22B) receiving the instructions corresponding to the assigned operations and as illustrated in FIG. 3A, the discrete testing device 22-6 generates a value indicating an impedance (resistance and/or reactance) of at least one of the first electrical circuit (e.g., electrical circuit 16A) and the second electrical circuit (e.g., electrical circuit 16B). In some forms, the first remote cooperative testing device (e.g., remote cooperative testing device 22A) transmits a signal indicating the impedance value to the computing device 30 for subsequent display and/or processing, as described below in further detail.

While the forms described above with reference to FIGS. 3A-3D discuss the operations of the remote cooperative testing devices 22 in response to receiving instructions from the computing device 30, it should be understood that any one of the remote cooperative testing devices 22 may include one or more processors configured to carry out the functionality of the computing device 30 in other forms.

Figure 4A:
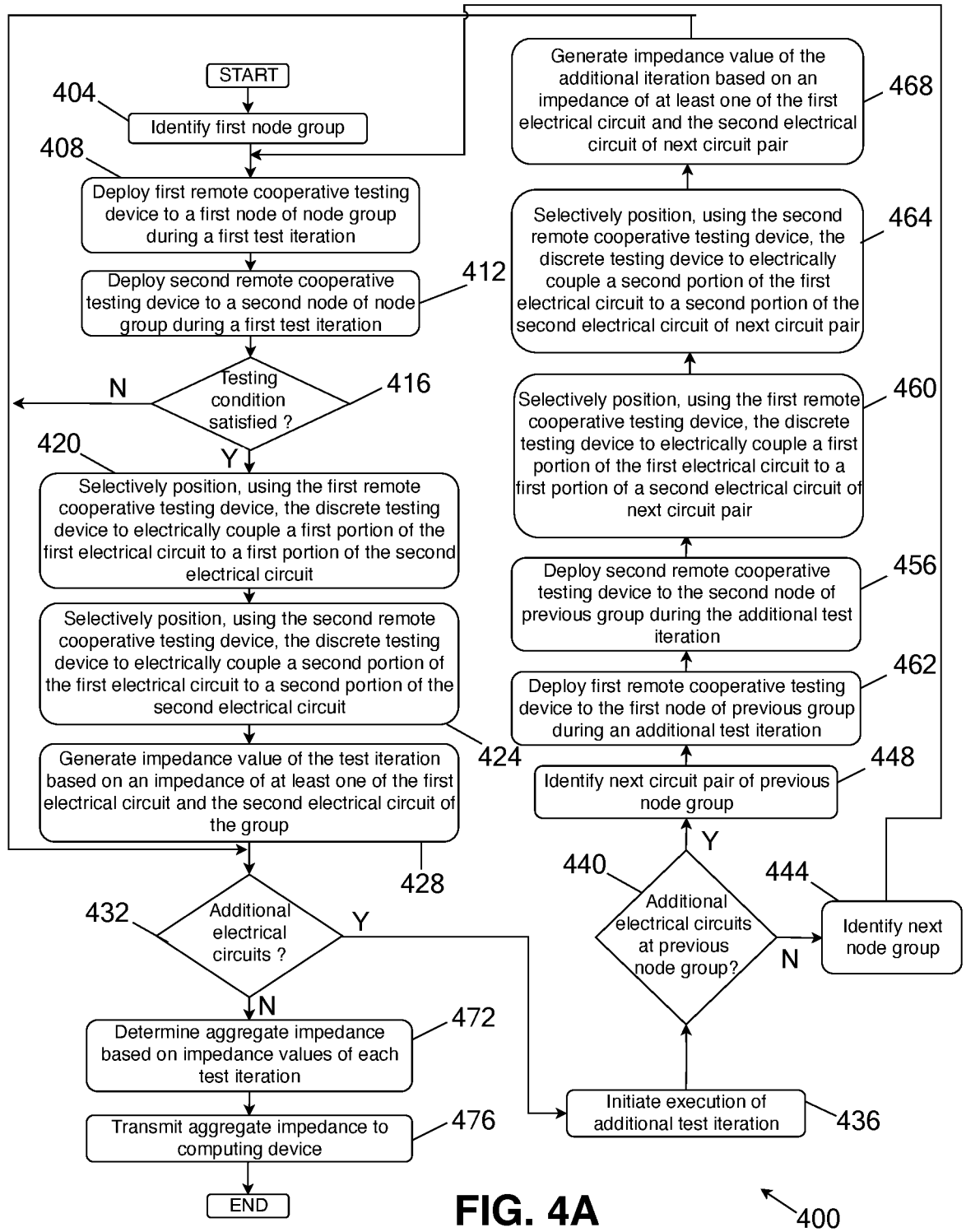
FIG. 4A is a flowchart of a testing procedure in accordance with the present disclosure.

Referring to FIG. 4A, an example testing routine 400 is provided and may be executed by at least one of the remote cooperative testing devices 22 and the computing device 30. It should be readily understood that the testing routine 400 is just an example implementation of at least one of the remote cooperative testing devices 22 and the computing device 30 and other control routines may be implemented in other forms.

With reference to FIG. 4A in conjunction with FIGS. 3A-3D, at 404, the testing routine 400 identifies a first node group. For example, the testing routine 400 may identify nodes 60A and 60B. At 408, the testing routine 400 deploys a first remote cooperative testing device 22A to a first node of the node group (e.g., node 60A) during a first test iteration. At 412, the testing routine 400 deploys a second remote cooperative testing device 22B to the second node of the node group (e.g., node 60B) during a first test iteration.

At 416, the testing routine 400 determines whether a testing condition is satisfied. In some forms, determining whether the testing condition is satisfied includes whether a conductive path can be formed between a first electrical circuit and a second electrical circuit of the node group (e.g., the testing condition is satisfied if a conductive path can be formed between electrical circuit 16A and electrical circuit 16B via the discrete testing device 22-6 and the conductive element 22-7). In some forms, determining whether the conductive path can be formed between the first electrical circuit and the second electrical circuit of the node group includes determining that a value indicating an impedance of the first electrical circuit and the second electrical circuit was not previously obtained and stored in a computer-readable medium of one of the remote cooperative testing devices 22 and the computer-readable medium 36 of the computing device 30. In some forms, determining whether the conductive path can be formed between the first electrical circuit and the second electrical circuit of the node group includes determining a first portion of the first electrical circuit (e.g., a first end of electrical circuit 16A) and the first portion of the second electrical circuit (e.g., a first end of electrical circuit 16B) are positioned at the first node (e.g., node 60A), and determining the second portion of the first electrical circuit (e.g., a second end of electrical circuit 16A) and the second portion of the second electrical circuit (e.g., a second end of electrical circuit 16B) are positioned at a second node of the group of nodes (e.g., node 60B). If the testing routine 400 determines that the testing condition is satisfied at 416, the routine proceeds to 420; otherwise, the routine proceeds to 432.

At 420, the testing routine 400 selectively positions, using the first remote cooperative testing device (e.g., remote cooperative testing device 22A), the discrete testing device 22-6 to electrically couple a first portion of the first electrical circuit (e.g., a first end of electrical circuit 16A) and the first portion of the second electrical circuit (e.g., a first end of electrical circuit 16B). In some forms, the first remote cooperative testing device (e.g., remote cooperative testing device 22A) travels to a location associated with the first portions of the first and second electrical circuits and selectively positions the discrete testing device 22-6 by, for example, actuating the testing probes 62 to extend from the first remote cooperative testing device and to electrically contact the first portions of the first and second electrical circuits, and/or rotating the first remote cooperative testing device such that the testing probes 62 electrically contact the first portions of the first and second electrical circuits.

At 424, the testing routine 400 selectively positions, using the second remote cooperative testing device (e.g., remote cooperative testing device 22B), the conductive element 22-7 to electrically couple a second portion of the first electrical circuit (e.g., a second end of electrical circuit 16A) and the second portion of the second electrical circuit (e.g., a second end of electrical circuit 16B). In some forms, the second remote cooperative testing device (e.g., remote cooperative testing device 22B) travels to a location associated with the second portions of the first and second electrical circuits and selectively positions the conductive element 22-7 by, for example, actuating the conductive element 22-7 to extend from the second remote cooperative testing device and to electrically contact the second portions of the first and second electrical circuits, and/or rotating the second remote cooperative testing device such that the conductive element 22-7 electrically contact the second portions of the first and second electrical circuits.

Figure 4B:
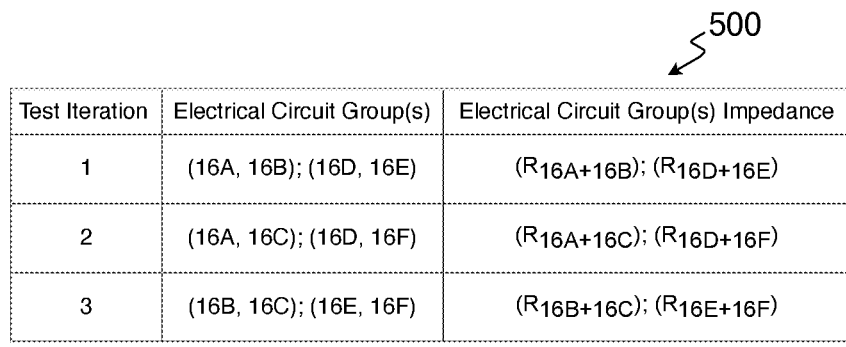
FIG. 4B is a table illustrating a plurality of test iterations of a test procedure of a symmetrical circuit configuration in accordance with the teachings of the present disclosure.
Figure 4C:
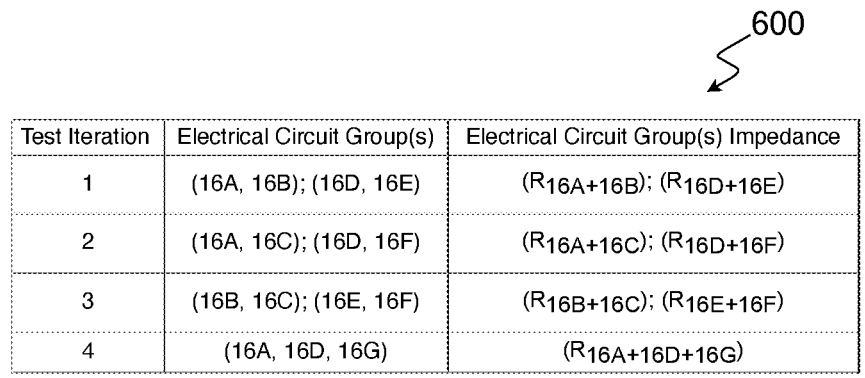
FIG. 4C is a table illustrating a plurality of test iterations of a test procedure of an asymmetrical circuit configuration in accordance with the teachings of the present disclosure.

At 428, the testing routine 400 generates an impedance value of the corresponding iteration based on an impedance (e.g., resistance and/or reactance) of at least one of the first electrical circuit (e.g., electrical circuit 16A) and the second electrical circuit (e.g., electrical circuit 16B). For example and as shown in table 500 of FIG. 4B, which illustrates the calculated impedances of the electrical circuits 16' of FIGS. 3A-3B at various testing iterations, the impedance obtained during the first iteration is the sum of the impedance of electrical circuit 16A and the impedance of electrical circuit 16B ($R_{16A+16B}$). As another non-limiting example and as shown in table 600 of FIG. 4C, which illustrates the calculated impedances of the electrical circuits 16' of FIGS. 3C-3D at various testing iterations, the impedance obtained during the first iteration is the sum of the impedance of electrical circuit 16A and the impedance of electrical circuit 16B ($R_{16A+16B}$).

At 432, the testing routine 400 determines whether additional electrical circuits are located within the manufacturing system 10. If so, the testing routine 400 proceeds to 436; otherwise, the testing routine 400 proceeds to 472. At 436, the testing routine 400 initiates the execution of an additional test iteration. At 440, the testing routine 400 determines whether additional electrical circuits exist at the node group of the previous testing iteration. For example and as shown in FIGS. 3A-3D, electrical circuit 16C is positioned between node 60A and node 60B. If the testing routine 400 determines that additional electrical circuits exist at the node group of the previous testing iteration, the testing routine 400 proceeds to 448; otherwise, the testing routine 400 proceeds to 444. At 444, the testing routine 400 identifies the next node group (e.g., node 60B and node 60C) and then proceeds to 408. At 448, the testing routine 400 identifies the next electrical circuit pair of the previous node group. In some forms, the testing routine 400 identifies the next electrical circuit pair as one for which an impedance has not been previously calculated.

At 452, the testing routine 400 deploys a first remote cooperative testing device 22A to an adjacent portion of the first node of the previous node group (e.g., node 60A) during an additional test iteration. At 456, the testing routine 400 deploys a second remote cooperative testing device 22B to an adjacent portion of the second node of the previous node group (e.g., node 60B) during the additional test iteration.

At 460, the testing routine 400 selectively positions, using the first remote cooperative testing device (e.g., remote cooperative testing device 22A), the discrete testing device 22-6 to electrically couple a first portion of the first electrical circuit (e.g., a first end of electrical circuit 16A) and a first portion of an additional electrical circuit (e.g., a first end of electrical circuit 16C) of the previous node group during the additional test iteration. In some forms, the first remote cooperative testing device (e.g., remote cooperative testing device 22A) travels to a location associated with the first portions of the first and additional electrical circuits and selectively positions the discrete testing device 22-6 by, for example, actuating the testing probes 62 to extend from the first remote cooperative testing device and to electrically contact the first portions of the first and second electrical circuits, and/or rotating the first remote cooperative testing device such that the testing probes 62 electrically contact the first portions of the first and additional electrical circuits.

At 464, the testing routine 400 selectively positions, using the second remote cooperative testing device (e.g., remote cooperative testing device 22B), the conductive element 22-7 to electrically couple a second portion of the first electrical circuit (e.g., a second end of electrical circuit 16A) and the second portion of the additional electrical circuit (e.g., a second end of electrical circuit 16C). In some forms, the second remote cooperative testing device (e.g., remote cooperative testing device 22B) travels to a location associated with the second portions of the first and additional electrical circuits and selectively positions the conductive element 22-7 by, for example, actuating the conductive element 22-7 to extend from the second remote cooperative testing device and to electrically contact the second portions of the first and additional electrical circuits, and/or rotating the second remote cooperative testing device such that the conductive element 22-7 electrically contact the second portions of the first and additional electrical circuits.

At 468, the testing routine 400 generates an impedance value of the corresponding iteration based on an impedance (e.g., resistance and/or reactance) of at least one of the first electrical circuit (e.g., electrical circuit 16A) and the additional electrical circuit (e.g., electrical circuit 16C). For example and as shown in table 500 of FIG. 4B, the impedance obtained during a second testing iteration is the sum of the impedance of electrical circuit 16A and the impedance of electrical circuit 16C ($R_{16A+16C}$). As another non-limiting example and as shown in table 600 of FIG. 4C, the impedance obtained during a second testing iteration is also the sum of the impedance of electrical circuit 16A and the impedance of electrical circuit 16C ($R_{16A+16C}$). The testing routine 400 then proceeds to 432.

At 472, the testing routine 400 determines an aggregate impedance of the manufacturing system 10 based on the impedance values obtained during each test iteration. In some forms, determining the aggregate impedance includes generating an augmented coefficient matrix from a system of linear equations representing the impedances obtained during each test iteration, identifying whether each entry of a column in the augmented coefficient matrix is equal to zero, and adjusting the augmented coefficient matrix such that the first entry in the first column is not equal to zero. In some forms, determining the aggregate impedance also includes multiplying the first row of the augmented coefficient matrix by a scalar so that a pivot is equal to one, and adding multiples of the first row of the augmented coefficient matrix such that the first entry of every other row is zero. In some forms, determining the aggregate impedance includes repeating the above steps until the augmented coefficient matrix is in reduced row echelon form, and identifying the last column of the augmented coefficient matrix as the value of the individual circuit impedances.

For example and as illustrated in table 500 of FIG. 5, the impedances obtained during the three testing iterations (shown as a function of x(n) below, wherein n represents a particular testing iteration) corresponding to the electrical circuits 16' illustrated in FIGS. 3A-3B can be represented using the following relations:

$$x(1)=R_{16A+16B} \tag{1}$$

$$x(1)=R_{16D+16E} \tag{2}$$

$$x(2)=R_{16A+16C} \tag{3}$$

$$x(2)=R_{16D+16F} \tag{4}$$

$$x(3)=R_{16B+16C} \tag{5}$$

$$x(3)=R_{16E+16F} \tag{6}$$

The augmented coefficient matrices may be represented using the following relations:

$$\begin{pmatrix} 1 & 1 & 0 & | & u \\ 0 & 1 & 1 & | & v \\ 1 & 0 & 1 & | & w \end{pmatrix} \tag{7}$$

$$\begin{pmatrix} 1 & 1 & 0 & | & x \\ 0 & 1 & 1 & | & y \\ 1 & 0 & 1 & | & z \end{pmatrix} \tag{8}$$

In relations (7) and (8), $u=R_{16A+16B}$, $v=R_{16B+16C}$, $w=R_{16A+16C}$, $x=R_{16D+16E}$, $y=R_{16E+16F}$, and $z=R_{16D+16F}$. Reducing the augmented coefficient matrices to reduced row echelon form results in the following relations:

$$\left(\begin{array}{ccc|c} 1 & 0 & 0 & \frac{u+w-v}{2} \\ 0 & 1 & 0 & \frac{u-w+v}{2} \\ 0 & 0 & 1 & \frac{v+w-u}{2} \end{array}\right) \quad (9)$$

$$\left(\begin{array}{ccc|c} 1 & 0 & 0 & \frac{x+z-y}{2} \\ 0 & 1 & 0 & \frac{x-z+y}{2} \\ 0 & 0 & 1 & \frac{z+y-x}{2} \end{array}\right) \quad (10)$$

Based on the reduced row echelon form of the augmented coefficient matrices, the impedance of electrical circuit 16A, 16B, 16C, 16D, 16E, and 16F may be $$\frac{u+w-v}{2}, \frac{u-w+v}{2}, \frac{v+w-u}{2}, \frac{x+z-y}{2}, \frac{x-z+y}{2}, \text{ and } \frac{z+y-x}{2},$$

respectively. It should be understood that other methods may be utilized to determine the aggregate impedance in other forms.

At 476, the testing routine 400 transmits the aggregate impedance to the computing device 30, which may generate and/or display the aggregate impedance in some forms. The routine then ends.

Figure 5:
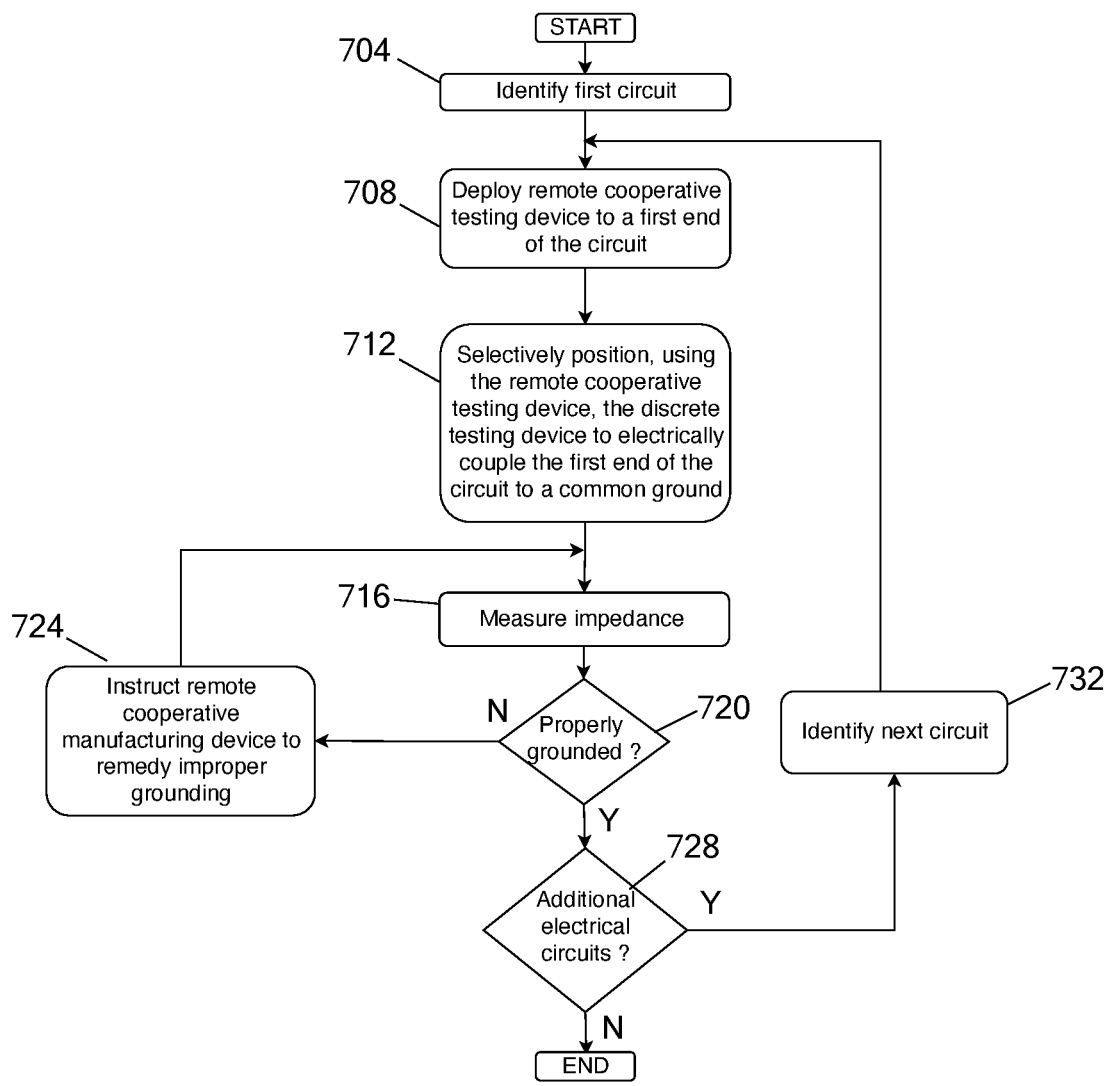
FIG. 5 is a flowchart of another testing procedure in accordance with the present disclosure.

Referring to FIG. 5, an example testing routine 700 is provided and may be executed by at least one of the remote cooperative testing devices 22, the remote manufacturing devices 18, and the computing device 30. It should be readily understood that the testing routine 700 is just an example implementation of at least one of the remote cooperative testing devices 22, the remote manufacturing devices 18, and the computing device 30 and other control routines may be implemented in other forms.

With reference to FIG. 5 in conjunction with FIGS. 3A-3D, at 704, the testing routine 700 identifies a first electrical circuit (e.g., electrical circuit 16A). At 708, the testing routine 700 deploys the remote cooperative testing device 22 to a first end of the first electrical circuit (e.g., a first end of the first electrical circuit 16A). At 712, the routine selectively positions, using the remote cooperative testing device 22, the discrete testing device 22-6 to electrically couple the first end of the first circuit to a common ground, such as the vehicle component 12. In some forms, the vehicle component 12 may include a dielectric coating positioned between the vehicle component 12 and the first electrical circuit. Accordingly, the testing probes 62 of the discrete testing device 22-6 have a geometry and shape that enables the testing probes 62 to penetrate any dielectric coatings disposed on the vehicle component 12 in order to connect the discrete testing device 22-6 to the common ground.

At 716, the testing routine 700 measures, using the remote cooperative testing device 22, an impedance. At 720, the testing routine 700 determines whether the electrical circuit is properly grounded based on the impedance. If so, the testing routine 700 proceeds to 728; otherwise, the testing routine 700 proceeds to 724. At 724, the routine instructs one of the remote manufacturing devices 18 to remedy the improper grounding (e.g., removing an improper short to ground) and then proceeds to 716. At 728, the testing routine 700 determines whether there are additional electrical circuits 16 in the manufacturing system 10. If so, the testing routine 700 proceeds to 732; otherwise, the testing routine 700 ends. At 732, the testing routine 700 identifies the next electrical circuit and proceeds to 708.

As described herein, the remote cooperative testing devices 22 enable a plurality of electrical circuits 16 to be tested for various electrical characteristics without the need for human intervention, test harnesses, and/or testing boards. As such, the speed, efficiency, and accuracy of testing the plurality of electrical circuits 16 improves while minimizing the amount of human intervention for performing said testing procedures.

It should also be understood that although a vehicle application has been illustrated and described herein, the teachings of the present disclosure are also applicable to other applications such as industrial manufacturing equipment, appliances, and other applications that include electrical circuits that are tested. Accordingly, the vehicle application should not be construed as limiting the scope of the present disclosure.

Unless otherwise expressly indicated herein, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice; material, manufacturing, and assembly tolerances; and testing capability.

As used herein, the phrase at least one of A, B, and C should be construed to mean a logical (A OR B OR C), using a non-exclusive logical OR, and should not be construed to mean "at least one of A, at least one of B, and at least one of C."

The description of the disclosure is merely exemplary in nature and, thus, variations that do not depart from the substance of the disclosure are intended to be within the scope of the disclosure. Such variations are not to be regarded as a departure from the spirit and scope of the disclosure. Furthermore, various omissions, substitutions, combinations, and changes in the forms of the systems, apparatuses, and methods described herein may be made without departing from the spirit and scope of the disclosure even if said omissions, substitutions, combinations, and changes are not explicitly described or illustrated in the figures of the disclosure.

In the figures, the direction of an arrow, as indicated by the arrowhead, generally demonstrates the flow of information (such as data or instructions) that is of interest to the illustration. For example, when element A and element B exchange a variety of information, but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, the term "module" and/or "controller" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The term memory is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The module may include one or more interface circuits. In some examples the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The apparatuses and methods described in this application may be partially or fully implemented by a special purpose computer created by configuring a general-purpose computer to execute one or more particular functions embodied in computer programs. The functional blocks, flowchart components, and other elements described above serve as software specifications, which can be translated into the computer programs by the routine work of a skilled technician or programmer.

What is claimed is:

1. A system for testing a plurality of electrical circuits, each electrical circuit having a plurality of nodes, the system comprising:
    a first remote cooperative testing device comprising a testing component and a first transceiver; and
    a second remote cooperative testing device comprising a conductive component and a second transceiver,
    wherein in response to receiving instructions from a remote computing device:
        the first remote cooperative testing device locates a first electrical circuit and a second electrical circuit of the plurality of electrical circuits and selectively positions the testing component to electrically couple a first portion of the first electrical circuit to a first portion of the second electrical circuit at a first node; and
        the second remote cooperative testing device selectively positions the conductive component to electrically couple a second portion of the first electrical circuit to a second portion of the second electrical circuit at a second node, thereby forming a testing circuit between the first node and the second node.

2. The system of claim 1, wherein the first remote cooperative testing device selectively positions the testing component to electrically couple the first portion of the first electrical circuit to the first portion of the second electrical circuit in response to a determination that the first electrical circuit and the second electrical circuit satisfy a testing condition.

3. The system of claim 2, wherein the testing condition is whether a conductive path can be formed between the first electrical circuit and the second electrical circuit.

4. The system of claim 1, wherein in response to the first remote cooperative testing device and the second remote cooperative testing device receiving instructions from the remote computing device:
    the testing component generates a value indicating an impedance of at least one of the first electrical circuit and the second electrical circuit; and
    the first remote cooperative testing device transmits a signal indicating the value to the remote computing device.

5. The system of claim 4, wherein the impedance comprises at least one of a resistance and a reactance.

6. The system of claim 1, wherein the first remote cooperative testing device and the second remote cooperative testing device each have a machine operated mode of transportation, which is at least one of a ground transportation mode, an air transportation mode, and a robotic arm transportation mode.

7. The system of claim 1, wherein in response to the first remote cooperative testing device and the second remote cooperative testing device receiving instructions from the remote computing device:
    the first remote cooperative testing device selectively positions a first testing probe of the testing component and a second testing probe of the testing component to electrically couple a first portion of the first electrical circuit to a first portion of the second electrical circuit.

8. The system of claim 7, wherein the testing component is one of an ohmmeter and an impedance meter.

9. The system of claim 1, wherein at least one of the first remote cooperative testing device and the second remote cooperative testing device is a miniature autonomous robotic vehicle.

10. A system for testing a plurality of electrical circuits, each electrical circuit having a plurality of nodes, the system comprising:
    a first remote cooperative testing device comprising a testing component and a first transceiver; and
    a second remote cooperative testing device comprising a conductive component and a second transceiver; and
    a processor configured to execute machine-readable instructions stored in a nontransitory computer-readable medium, wherein the machine-readable instructions comprise transmitting, using the processor, a first navigation signal to the first remote cooperative testing device and the second remote cooperative testing device, wherein the first navigation signal causes:
    the first remote cooperative testing device to locate a first electrical circuit and a second electrical circuit of the plurality of electrical circuits and selectively position the testing component to electrically couple a first portion of the first electrical circuit to a first portion of the second electrical circuit at a first node; and
    the second remote cooperative device to selectively position the conductive component to electrically couple a second portion of the first electrical circuit to a second portion of the second electrical circuit at a second node, thereby forming a testing circuit between the first node and the second node; and wherein the machine-readable instructions comprise generating, using the processor, an output representing at least one of an impedance of the first electrical circuit and an impedance of the second electrical circuit.

11. The system of claim 10, wherein the processor is located on one of the first remote cooperative testing device, the second remote cooperative testing device, and within a remote computing device.

12. The system of claim 10, wherein the first remote cooperative testing device selectively positions the testing component to electrically couple the first portion of the first electrical circuit to the first portion of the second electrical circuit in response to a determination that the first electrical circuit and the second electrical circuit satisfy a testing condition.

13. The system of claim 12, wherein the testing condition indicates whether a conductive path can be formed between the first electrical circuit and the second electrical circuit.

14. A method for testing a plurality of electrical circuits, each electrical circuit having a plurality of nodes, the method comprising:
deploying a first remote cooperative testing device to a first node of the plurality of nodes and deploying a second remote cooperative testing device to a second node of the plurality of nodes, the first remote cooperative testing device comprising a testing component and the second remote cooperative testing device comprising a conductive component; and
determining whether a testing condition is satisfied, wherein in response to determining that the testing condition is satisfied:
selectively positioning, using the first remote cooperative testing device, the testing component to electrically couple a first portion of the first electrical circuit to a first portion of the second electrical circuit; and
selectively positioning, using the second remote cooperative testing device, the conductive component to electrically couple a second portion of the first electrical circuit to a second portion of the second electrical circuit, thereby forming a testing circuit between the first node and the second node.

15. The method of claim 14, wherein determining whether the testing condition is satisfied further comprises determining whether a conductive path can be formed between the first electrical circuit and the second electrical circuit.

16. The method of claim 15, wherein determining the conductive path can be formed between the first electrical circuit and the second electrical circuit further comprises:
determining a value indicating an impedance of the first electrical circuit and the second electrical circuit is not stored in a nontransitory computer-readable medium;
determining the first portion of the first electrical circuit and the first portion of the second electrical circuit are positioned at the first node; and
determining the second portion of the first electrical circuit and the second portion of the second electrical circuit are positioned at a second node of the plurality of nodes.

17. The method of claim 14, wherein in response to determining whether the testing condition is satisfied, the method comprises generating, using the testing component, a value indicating an impedance of at least one of the first electrical circuit and the second electrical circuit.

18. The method of claim 14, wherein in response to determining the testing condition is satisfied, the method comprises executing a first test iteration of a plurality of test iterations, wherein executing the first test iteration comprises:
deploying the first remote cooperative testing device to the first node associated with the first electrical circuit and the second electrical circuit of the plurality of electrical circuits during the first test iteration;
deploying the second remote cooperative testing device to the second node associated with the first electrical circuit and the second electrical circuit of the plurality of electrical circuits during the first test iteration;
selectively positioning, using the first remote cooperative testing device, the testing component to electrically couple the first portion of the first electrical circuit to the first portion of the second electrical circuit during the first test iteration; and
selectively positioning, using the second remote cooperative testing device, the conductive component to electrically couple the second portion of the first electrical circuit to the second portion of the second electrical circuit to form the testing circuit between the first node and the second node during the first test iteration.

19. The method of claim 18, wherein in response to executing the first test iteration, the method comprises executing an additional test iteration of the plurality of test iterations, wherein executing the additional test iteration comprises:
identifying an additional circuit of the plurality of circuits;
identifying a first location associated with the additional circuit, wherein the first location is one of an adjacent portion of the first node and a first additional node of the plurality of nodes;
identifying a second location associated with the additional circuit, wherein the second location is one of an adjacent portion of the second node and a second additional node of the plurality of nodes;
deploying the first remote cooperative testing device to the first location and the second remote cooperative testing device to the second location;
determining whether the testing condition is satisfied during the additional test iteration, wherein in response to determining that the testing condition is satisfied:
selectively positioning, using the first remote cooperative testing device, the testing component to electrically couple the first portion of the first electrical circuit to a first portion of the additional electrical circuit; and
selectively positioning, using the second remote cooperative testing device, the conductive component to electrically couple the second portion of the first electrical circuit to a second portion of the additional electrical circuit to form an additional testing circuit between the first location and the second location.

20. The method of claim 19, further comprising generating, using the testing component, an aggregate impedance of the plurality of electrical circuits, wherein the aggregate impedance is based on at least one of:
a first value indicating an impedance of the first electrical circuit and the second electrical circuit; and
an additional value indicating an impedance of the first electrical circuit and the additional electrical circuit.

* * * * *